(12) United States Patent
Tsuchiya et al.

(10) Patent No.: US 10,084,052 B2
(45) Date of Patent: Sep. 25, 2018

(54) SEMICONDUCTOR DEVICE AND METHOD FOR MANUFACTURING THE SAME

(71) Applicant: DENSO CORPORATION, Kariya, Aichi-pref. (JP)

(72) Inventors: Yoshinori Tsuchiya, Kariya (JP); Shinichi Hoshi, Kariya (JP); Masaki Matsui, Kariya (JP); Kenji Itoh, Nagakute (JP)

(73) Assignee: DENSO CORPORATION, Kariya (JP)

( * ) Notice: Subject to any disclaimer, the term of this patent is extended or adjusted under 35 U.S.C. 154(b) by 21 days.

(21) Appl. No.: 15/514,167

(22) PCT Filed: Sep. 14, 2015

(86) PCT No.: PCT/JP2015/004650
§ 371 (c)(1),
(2) Date: Mar. 24, 2017

(87) PCT Pub. No.: WO2016/051691
PCT Pub. Date: Apr. 7, 2016

(65) Prior Publication Data
US 2017/0301765 A1   Oct. 19, 2017

(30) Foreign Application Priority Data

Sep. 29, 2014  (JP) ................ 2014-198479

(51) Int. Cl.
*H01L 29/778*  (2006.01)
*H01L 29/423*  (2006.01)
(Continued)

(52) U.S. Cl.
CPC .... *H01L 29/4236* (2013.01); *H01L 21/28264* (2013.01); *H01L 29/2003* (2013.01);
(Continued)

(58) Field of Classification Search
CPC ................................. H01L 29/66462
See application file for complete search history.

(56) References Cited

U.S. PATENT DOCUMENTS

2006/0011915 A1   1/2006  Saito et al.
2009/0194791 A1   8/2009  Kanamura
(Continued)

FOREIGN PATENT DOCUMENTS

JP   2000-252458 A    9/2000
JP   2001-320054 A   11/2001
(Continued)

OTHER PUBLICATIONS

Kashiwagi, J. "Recessed-Gate Enchancement-Mode GaN MOSFETs With a Double-Insulator Gate Providing 10-MHz Switching Operation" IEEE Elec. Dev. Lett. vol. 34, No. 9 Sep. 2013 pp. 1109-1111.*
(Continued)

*Primary Examiner* — Asok K Sarkar
*Assistant Examiner* — Grant Withers
(74) *Attorney, Agent, or Firm* — Posz Law Group, PLC

(57) ABSTRACT

In a semiconductor device, a gate insulating film is provided with a multi-layer structure including a first insulating film and a second insulating film. The first insulating film is formed of an insulating film containing an element having an oxygen binding force larger than that of an element contained in the second insulating film, and the total charge amount is increased. Specifically, by performing oxygen anneal, it is possible to perform the step of supplying oxygen into an aluminum oxide film and increase the total charge amount. This allows a negative fixed charge density in the gate insulating film in the vicinity of an interface with a GaN layer to be set to a value of not less than $2.5 \times 10^{11}$ cm$^{-2}$ and allows a normally-off element to be reliably provided.

12 Claims, 5 Drawing Sheets

(51) Int. Cl.
  *H01L 29/66*  (2006.01)
  *H01L 29/20*  (2006.01)
  *H01L 29/205*  (2006.01)
  *H01L 29/51*  (2006.01)
  *H01L 29/49*  (2006.01)
  *H01L 21/28*  (2006.01)

(52) U.S. Cl.
  CPC ........ *H01L 29/205* (2013.01); *H01L 29/4916* (2013.01); *H01L 29/513* (2013.01); *H01L 29/517* (2013.01); *H01L 29/518* (2013.01); *H01L 29/66462* (2013.01); *H01L 29/7786* (2013.01); *H01L 29/7787* (2013.01)

(56) References Cited

U.S. PATENT DOCUMENTS

| | | | |
|---|---|---|---|
| 2013/0032819 | A1 | 2/2013 | Kambayashi et al. |
| 2013/0240896 | A1* | 9/2013 | Ozaki ................. H01L 29/7786 257/76 |
| 2013/0292700 | A1 | 11/2013 | Teramoto et al. |
| 2014/0080277 | A1 | 3/2014 | Kanamura |
| 2014/0264364 | A1 | 9/2014 | Kanamura |
| 2014/0264451 | A1* | 9/2014 | Ozaki ................. H01L 29/513 257/194 |
| 2014/0367699 | A1 | 12/2014 | Teramoto et al. |
| 2016/0071732 | A1* | 3/2016 | Nishii ............... H01L 21/28264 257/192 |
| 2017/0077277 | A1* | 3/2017 | Saito ................. H01L 29/7786 |

FOREIGN PATENT DOCUMENTS

| | | |
|---|---|---|
| JP | 2003-224277 A | 8/2003 |
| JP | 2004-311961 A | 11/2004 |
| JP | 2007-081346 A | 3/2007 |
| JP | 2007-311740 A | 11/2007 |
| JP | 2009-302435 A | 12/2009 |
| JP | 2010-098076 A | 4/2010 |
| JP | 2011-192719 A | 9/2011 |
| JP | 2011-198837 A | 10/2011 |

OTHER PUBLICATIONS

Kim, H "Effects of PECVD SiO2 Gate Dielectric Thickness on Recessed AlGaN/GaN MOS-HFETs" Jour. of Semi. Tech. and Sci. vol. 18, No. 20 Apr. 2018 pp. 187-192.*

Hwang, I. "High-Performance E-Mode AlGaN/GaN MIS-HEMT with Dual Gate Insulator Employing SiON and HfON" Phys. Stat. Sol. A Nov. 14, 2017 pp. 1700650-1700650.*

Gao, T. "Integrated enhancement/depletion-mode GaN MIS-HEMTs for high-speed mixed-signal applications" Phys. Stat. Sol. A 213, No. 5 Feb. 2016 pp. 1241-1245.*

Bajaj, S. "Simulation of Enhancement Mode GaN HEMTs with Threshold > 5V using P-type Buffer" available online at http://inspirehep.net/record/1404954/ Nov. 12, 2015 pp. 1-6.*

Chandrasekar, H. "Dielectric Engineering of HfO2 Gate Stacks Towards Normally-On and Normally-Off GaN HEMTs on Silicon" Available online at https://arxiv.org/abs/1708.03811 Aug. 12, 2017 pp. 1-6.*

* cited by examiner

FIG. 1
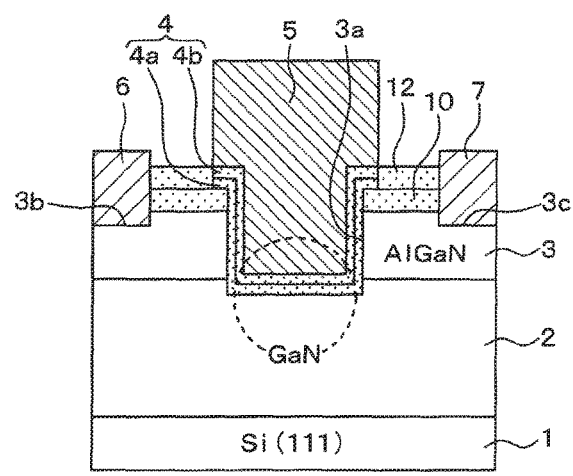
FIG. 2
FIG. 3
| | $N_2$ ANNEAL | $O_2$ ANNEAL |
|---|---|---|
| FIXED CHARGES ($\times 10^{11} cm^{-2}$) | +1.22 | −1.56 |

FIG. 4
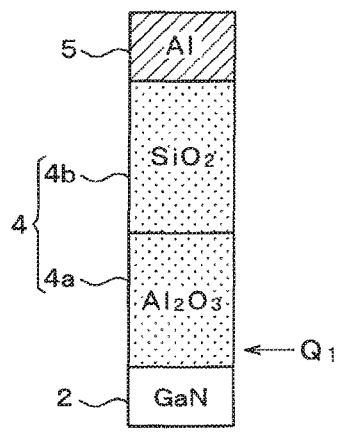
FIG. 5
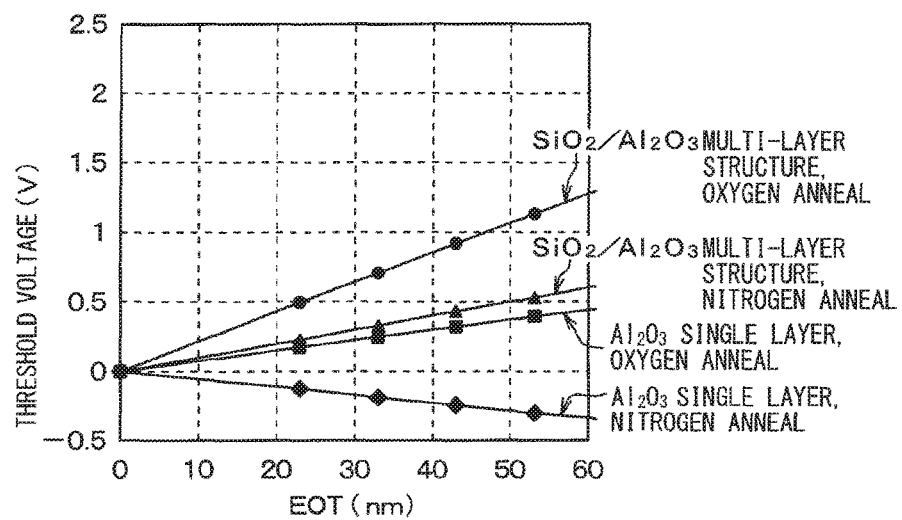
FIG. 6
|  | N$_2$ ANNEAL | O$_2$ ANNEAL |
|---|---|---|
| FIXED CHARGES (× 10$^{11}$cm$^{-2}$) | −2.16 | −4.60 |

SEMICONDUCTOR DEVICE AND METHOD FOR MANUFACTURING THE SAME

CROSS REFERENCE TO RELATED APPLICATIONS

This application is a U.S. national stage application of International Patent Application No. PCT/JP2015/004650 filed on Sep. 14, 2015 and is based on Japanese Patent Application No. 2014-198479 filed on Sep. 29, 2014, the disclosure of which is incorporated herein by reference.

TECHNICAL FIELD

The present disclosure relates to a semiconductor device having a switching device using a compound semiconductor containing gallium nitride (hereinafter referred to as GaN) as a main component and a method for manufacturing the same.

BACKGROUND

There has conventionally been a semiconductor device including a HEMT (High electron mobility transistor) which is a field effect transistor having a heterojunction structure with GaN as a switching device. The HEMT is appropriate for higher-speed switching since GaN has a wide band gap, a high dielectric strength voltage, and a high saturation electron velocity.

For example, a HEMT using a heterojunction structure including aluminum gallium nitride (hereinafter referred to as AlGaN) and GaN is assumed to be a structure including a buffer layer and a heterojunction structure on a silicon substrate. The heterojunction structure is assumed to be a structure in which, e.g., an AlGaN layer is stacked on a GaN layer. The HEMT is made so that a gate electrode is formed on the AlGaN layer through a gate insulating film, and a source electrode and a drain electrode are formed on a top surface of the AlGaN layer on opposite sides of the gate electrode.

It has been proposed that, in a semiconductor device including such a HEMT, a gate insulating film is formed of a multi-layer film including, e.g., alumina ($AlO_x$) and a silicon dioxide film ($SiO_2$) (see Patent Literature 1). When such a structure is provided, interdiffusion of Si and Ga at the interface between the GaN layer and the gate insulating film is suppressed to allow an interface state to be suppressed. In addition, even when alumina is used, an energy band gap Eg is as large as that of $SiO_2$. Accordingly, it is also possible to suppress a leakage current.

A structure has also been proposed in which a gate insulating film is formed of a multi-layer film including a layer which contains aluminum (Al), but does not contain nitrogen (N) and a layer which contains silicon (Si) and oxygen (O), and an upper layer is formed thicker than a lower layer. Additionally, a structure has also been proposed in which a gate insulating film is formed of a multi-layer film including aluminum oxide ($Al_2O_3$) and a silicon dioxide film and either one of the films is formed of a microwave plasma film.

PATENT LITERATURE

Patent Literature 1: JP 2011-181752 A

SUMMARY

However, each of the HEMTs having the above-described structures functions as a normally-on switching device in which a current flows even when a gate voltage is 0 V. Therefore, each of the HEMTs having the structures cannot be provided as a normally-off device which is required by, e.g., a vehicle-mounted device or the like. Or a device in which a minimum gate threshold voltage required in consideration of device properties or a usage environment is not less than 0.5 cannot be provided when a gate insulating film has a thickness required to provide a low-ON-resistance device.

An object of the present disclosure is to provide a semiconductor device having a normally-off HEMT and a method for manufacturing the same.

In accordance with a first aspect of the present disclosure, a semiconductor device includes a switching device. The switching device includes: a substrate formed of a semi-insulating material or a semiconductor material; a channel forming layer having a first nitride semiconductor layer formed of GaN and a second nitride semiconductor layer which form a heterojunction structure on the substrate and having a recessed portion formed through partial removal of the second nitride semiconductor layer to expose the first nitride semiconductor layer; a gate structure including a gate insulating film disposed in the recessed portion and a gate electrode disposed on the gate insulating film; and a source electrode and a drain electrode disposed on the channel forming layer on opposite sides of the gate structure. In such a configuration, the gate insulating film is provided with a multi-layer structure including a first insulating film disposed on a surface of the recessed portion and a second insulating film disposed on the first insulating film. An element contained in the first insulating film has an oxygen binding force larger than that of an element contained in the second insulating film. The gate insulating film has negative fixed charges in the vicinity of an interface with the first nitride semiconductor layer, and the density of the negative fixed charges is not less than $2.5 \times 10^{11}$ $cm^{-2}$.

When the gate insulating film is thus provided with the multi-layer structure including the first and second insulating films and the first insulating film is thus formed of an insulating film containing the element having the oxygen binding force larger than that of the element contained in the second insulating film, the negative fixed charge density in the gate insulating film in the vicinity of the interface with the first nitride semiconductor layer is set to a value of not less than $2.5 \times 10^{11}$ $cm^{-2}$. This allows a normally-off element to be reliably provided.

In accordance with a second aspect of the present disclosure, a semiconductor device includes a switching device. The switching device includes: a substrate formed of a semi-insulating material or a semiconductor material; a channel forming layer having a first nitride semiconductor layer and a second nitride semiconductor layer which form a heterojunction structure on the substrate and having a recessed portion formed through partial removal of the second nitride semiconductor layer to expose the first nitride semiconductor layer; a gate structure including a gate insulating film disposed in the recessed portion and a gate electrode disposed on the gate insulating film; and a source electrode and a drain electrode disposed on the channel forming layer on opposite sides of the gate structure. In such a configuration, the gate insulating film is provided with a multi-layer structure including a first insulating film disposed on a top surface of the recessed portion and a second insulating film disposed on the first insulating film. The first and second insulating films are formed of the same metal oxide or metal nitride, and the metal oxide or metal nitride forming the first insulating film has an oxygen vacancy concentration lower than that of the metal oxide or metal nitride forming the second insulating film.

Even when the respective constituent materials of the first and second insulating films contain the same main components, by setting the oxygen vacancy concentration in the first insulating film lower than that in the second insulating film, it is possible to provide a normally-off element.

In accordance with a third aspect of the present disclosure, a semiconductor device includes a switching device. The switching device includes: a substrate formed of a semi-insulating material or a semiconductor material; a channel forming layer having a first nitride semiconductor layer formed of GaN and a second nitride semiconductor layer which form a heterojunction structure on the substrate and having a recessed portion formed through partial removal of the second nitride semiconductor layer to expose the first nitride semiconductor layer; a gate structure including a gate insulating film disposed in the recessed portion and a gate electrode disposed on the gate insulating film; and a source electrode and a drain electrode disposed on the channel forming layer on opposite sides of the gate structure. In such a configuration, the gate insulating film is provided with a multi-layer structure including a first insulating film disposed on a top surface of the recessed portion and a second insulating film disposed on the first insulating film. An element contained in the second insulating film has an oxygen binding force larger than that of an element contained in the first insulating film and a negative fixed charge density in the first insulating film in the vicinity of an interface with the first nitride semiconductor layer is not less than $2.5 \times 10^{11}$ cm$^{-2}$.

Thus, it is also possible to use materials in which the element contained in the second insulating film has the oxygen binding force larger than that of the element contained in the first insulating film. In this case also, when oxygen anneal which fills the first insulating film with oxygen is performed before the second insulating film is formed and then a heat history in the subsequent step is appropriately controlled, the negative fixed charge density in the first insulating film in the vicinity of the interface with the first nitride semiconductor layer is not less than $2.5 \times 10^{11}$ cm$^{-2}$ and therefore a threshold voltage can be increased. Accordingly, it is possible to provide a normally-off element.

A method of manufacturing a semiconductor device in accordance with a fourth aspect of the present disclosure corresponds to a method of manufacturing the semiconductor device in accordance with the first aspect and includes forming the gate insulating film. The forming of the gate insulating film includes forming a first insulating film on a surface of the recessed portion and forming a second insulating film on the first insulating film. In the forming of the first insulating film and the forming of the second insulating film, materials are used such that an element contained in the first insulating film has an oxygen binding force larger than that of an element contained in the second insulating film. The method further includes performing oxygen anneal to fill the first insulating film with oxygen, after the forming of the first insulating film and before or after the forming of the second insulating film.

Thus, the oxygen anneal is performed to fill the first insulating film with oxygen. Accordingly, it is possible to set the negative fixed charge density in the first insulating film in the vicinity of the interface with the first nitride semiconductor layer to a value of not less than $2.5 \times 10^{11}$ cm$^{-2}$ and provide a normally-off element.

A method of manufacturing a semiconductor device in accordance with a fifth aspect of the present disclosure corresponds to a method of manufacturing the semiconductor device in accordance with the second aspect of the present disclosure, and includes forming the gate insulating film. The forming of the gate insulating film includes forming a first insulating film on a surface of the recessed portion and forming a second insulating film on the first insulating film. In the forming of the first insulating film and the forming of the second insulating film, the first and second insulating films are formed of the same metal oxide or metal nitride. The method further includes performing oxygen anneal to fill the first insulating film with oxygen, after the forming of the first insulating film and before the forming of the second insulating film.

Thus, after the first insulating film is formed and before the second insulating film is formed, oxygen anneal is performed to fill the first insulating film with oxygen. As a result, an oxygen vacancy concentration is lower in the first insulating film than in the second insulating film to allow a normally-off element to be provided.

A method of manufacturing a semiconductor device in accordance with a sixth aspect of the present disclosure corresponds to a method of manufacturing the semiconductor device in accordance with the third aspect and includes forming the gate insulating film. The forming of the gate insulating film includes forming a first insulating film on a surface of the recessed portion and forming a second insulating film on the first insulating film. In the forming of the first insulating film and the forming of the second insulating film, materials are used such that an element contained in the second insulating film has an oxygen binding force larger than that of an element contained in the first insulating film. In addition, the method further includes forming the gate electrode, and forming of the source electrode and the drain electrode. The forming of the second insulating film, the forming of the gate electrode, and the forming of the source electrode and the drain electrode each performed after the forming of the first insulating film are performed in a process at a temperature of 700° C. or less.

Thus, materials are used such that the element contained in the second insulating film has the oxygen binding force larger than that of the element contained in the first insulating film. In addition, the steps subsequent to forming the first insulating film are performed in the temperature process at 700° C. or less to thus suppress oxygen leak from the first insulating film. As a result, a negative fixed charge density in the first insulating film in the vicinity of the interface with the first nitride semiconductor layer is not less than $2.5 \times 10^{11}$ cm$^{-2}$ to allow a threshold voltage to be increased. Accordingly, it is possible to provide a normally-off element.

The above and other objects, features and advantages of the present disclosure will become more apparent from the following detailed description made with reference to the accompanying drawings, in which like parts are designated by like reference numbers and in which:

FIG. 1 is a cross-sectional view of a semiconductor device having a horizontal HEMT according to a first embodiment of the present disclosure;

FIG. 2 is a view showing a cross-sectional structure of a gate insulating film at the portion enclosed by the broken line in FIG. 1;

FIG. 3 is a chart showing a charge density when a gate insulating film is formed of a single-layer aluminum oxide film, and nitrogen anneal and oxygen anneal are performed;

FIG. 4 is a cross-sectional view showing a gate insulating film formed of a multi-layer structure including an aluminum oxide film and a silicon dioxide film;

FIG. 5 is a graph showing the relationship between the equivalent oxide thickness of the thickness of the aluminum oxide film in the configuration in FIG. 4 and a threshold voltage;

FIG. 6 is a chart showing a negative fixed charge density in the vicinity of an interface with a GaN layer when a gate insulating film is formed of a multi-layer structure including an aluminum oxide film and a silicon dioxide film, and nitrogen anneal and oxygen anneal are performed;

DETAILED DESCRIPTION

Figure 7A:
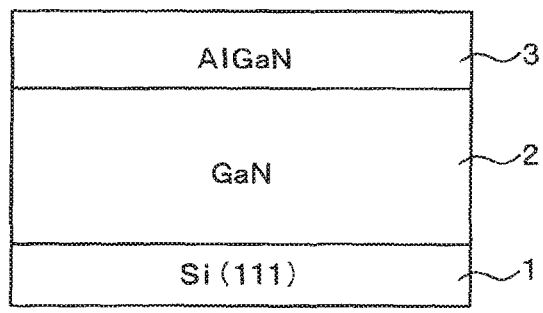
FIG. 7A is a cross-sectional view showing a manufacturing process of the semiconductor device shown in FIG. 1.

The following will describe the embodiments of the present disclosure based on the drawings. In the following description of the different embodiments, like or equivalent component parts are designated by like reference characters or numerals.

First Embodiment

A first embodiment of the present disclosure will be described. The present embodiment will describe a semiconductor device including a horizontal HEMT, which is one of GaN-HEMT devices, as a semiconductor device having a switching device using a compound semiconductor containing GaN as a main component.

As shown in FIG. 1, the semiconductor device according to the present embodiment includes the horizontal HEMT. The HEMT is configured as follows.

The horizontal HEMT is formed using a structure in which a GaN layer 2 and an n-type AlGaN layer 3 are stacked on a top surface of a substrate 1 as a compound semiconductor substrate. In the GaN layer 2 forming an AlGaN/GaN interface with the AlGaN layer 3, a two-dimensional electron gas (hereinafter referred to as 2DEG) carrier is induced by a piezoelectric effect and a polarization effect.

The substrate 1 is formed of a semi-insulating film or a semiconductor material such as, e.g., SiC or sapphire, though Si(111) is shown as an example in FIG. 1. On the substrate 1, the GaN layer 2 and the AlGaN layer 3 are formed by, e.g., heteroepitaxial growth. The specific resistance value of the compound semiconductor substrate may arbitrarily be adjusted appropriately using the impurity concentrations of the individual layers included in the compound semiconductor substrate in accordance with the properties of a target device. It is also possible to interpose an AlGaN—GaN superlattice layer or the like between the GaN layer 2 and the substrate 1 and improve the crystallinity of the GaN layer 2. Note that the crystallinity mentioned herein is a defect, dislocation, or the like in the GaN layer 2 and affects electric and optical properties.

Over a channel portion in the compound semiconductor substrate, a recess-shaped portion (recessed portion) $3a$ is formed so as to extend from the top surface of the AlGaN layer 3 and reach the GaN layer 2. Also, on both sides of the recess-shaped portion $3a$ in the compound semiconductor substrate, trench portions $3b$ and $3c$ are formed to extend from the top surface of the AlGaN layer 3 to predetermined depths.

At the place where the recess-shaped portion $3a$ is formed, a gate structure including a gate insulating film 4 and a gate electrode 5 which are stacked in and around the recess-shaped portion $3a$ is provided.

As shown in FIG. 2, the gate insulating film 4 is formed of a multi-layer film including a first insulating film $4a$ and a second insulating film $4b$. The first insulating film $4a$ is formed of an insulating film containing an element having an oxygen bonding force larger than that of the element contained in the second insulating film $4b$ and formed of a metal oxide such as an aluminum oxide film ($Al_2O_3$), titanium oxide ($TiO_2$), or hafnium oxide ($HfO_2$), a metal nitride such as aluminum nitride (AlN), or the like. The second insulating film $4b$ is formed on the first insulating film $4a$, has an oxygen vacancy concentration higher than that of the first insulating film $4a$, and is formed of a silicon dioxide film ($SiO_2$), a silicon oxynitride film (SiON), or the like. The gate electrode 5 is formed of polysilicon doped with aluminum, phosphorus, arsenic, or boron as an impurity, or the like. When the gate electrode 5 is formed of polysilicon doped with an impurity, the work function of the gate electrode is increased by doping polysilicon with boron (B) to allow the effect of suppressing a gate leakage current to be obtained.

Note that, on the top surface of the gate electrode 5, a gate wiring layer formed of Al or the like is formed, though not shown. As the respective materials of the gate electrode and the gate insulating film, optimum materials and the structures thereof may be selected appropriately in view of the threshold voltage, gate breakdown voltage, long-time reliability, and the like of the target device.

On the other hand, in the place at the top surface of the AlGaN layer 3 where the trench portion $3b$ is located, the source electrode 6 is formed so as to enter the trench portion $3b$ while, in the place at the top surface of the AlGaN layer 3 where the trench portion $3c$ is located, the drain electrode 7 is formed so as to enter the trench portion $3c$. The source electrode 6 and the drain electrode 7 are brought into ohmic contact with the respective top surfaces of the trench portions $3b$ and $3c$. Note that the gate electrode 5, the source electrode 6, and the drain electrode 7 are electrically isolated from each other by an interlayer film such as an oxide film 10 described later.

Thus, the horizontal HEMT according to the present embodiment is configured. The dimensions of the individual portions of the horizontal HEMT thus configured are arbitrary. For example, the source-to-gate distance and the gate-to-drain distance may be determined appropriately in view of the ON-resistance and breakdown voltage of the target device.

In the horizontal HEMT thus configured, a gate voltage is applied to the gate electrode 5 to thus allow the horizontal HEMT to perform a switching operation. That is, the gate voltage is applied to the gate electrode 5 to thus control the density of an electron layer (channel) generated at the interface between the GaN layer 2 and the gate insulating film 4 under the gate electrode 5 and a voltage is applied between the source electrode and the drain electrode to thus allow the horizontal HEMT to perform the operation of allowing a current to flow between the source electrode and the drain electrode.

In such a horizontal HEMT, as described above, the gate insulating film 4 is provided with a double-layer structure including the first and second insulating films 4a and 4b in which the oxygen vacancy concentration is higher in the second insulating film 4b than in the first insulating film 4a. By providing such a structure, it is possible to provide a horizontal normally-off HEMT. A description will be given thereof with reference to FIGS. 3 to 6.

First, for the purpose of reference, a description will be given of the case where the gate insulating film 4 is formed of a single-layer structure including an aluminum oxide film ($Al_2O_3$).

The gate insulating film 4 was formed of the single-layer structure including the aluminum oxide film, not the multi-layer structure including the first and second insulating films 4a and 4b described above and, on the aluminum oxide film, the gate electrode 5 was formed of, e.g., aluminum (Al). Then, a change in the charge density (surface density: $cm^{-2}$) in the aluminum oxide film in the vicinity of the interface between the aluminum oxide film and the GaN layer 2 was examined in each of the cases where nitrogen ($N_2$) anneal was performed and where oxygen ($O_2$) anneal was performed. As a result, when the nitrogen anneal was performed, positive fixed charges were formed and an intended threshold voltage was not obtained, so a normally-on element was provided. By contrast, when the oxygen anneal was performed, negative fixed charges, which are opposite to the positive fixed charges formed when the nitrogen anneal was performed, were generated in the aluminum oxide film in the vicinity of the interface between the aluminum oxide film and the GaN layer 2. Nevertheless, a voltage of not less than 0.5 V as the intended threshold voltage was not obtained.

Specifically, as shown in FIG. 3, the respective charge density in the aluminum oxide film in the vicinity of the interface between the aluminum oxide film and the GaN layer 2 was $+1.22 \times 10^{11}$ $cm^{-2}$ (where "+" represents positive fixed charges with the positive sign) when the nitrogen anneal was performed, and was $-1.56 \times 10^{11}$ $cm^{-2}$ (where "−" represents negative fixed charges with the negative sign) when the oxygen anneal was performed. By thus performing the oxygen anneal, the step of supplying oxygen (O) into the aluminum oxide film could be performed to allow the negative fixed charges to be increased compared to the case where the nitrogen anneal was performed. By thus increasing the negative fixed charges in the aluminum oxide film, it is possible to bring the threshold voltage closer to a positive value and bring the element closer to a normally-off element.

Next, a description will be given of the case where the gate insulating film 4 is provided with the multi-layer structure including the first and second insulating films 4a and 4b.

As shown in FIG. 4, the first insulating film 4a was formed of an aluminum oxide film, the second insulating film 4b was formed of a silicon dioxide film, and the gate electrode 5 was formed of, e.g., aluminum on the silicon dioxide film. Then, a fixed charge density (Q1) in the aluminum oxide film in the vicinity of the interface between the aluminum oxide film and the GaN layer 2 was examined in each of the cases where nitrogen anneal was performed and where oxygen anneal was performed. As a result, in the case where the nitrogen anneal was performed, when the thickness of the aluminum oxide film was not more than a predetermined value, an intended threshold voltage was not obtained so that the resulting element had a threshold voltage of not more than 0.5 V. By contrast, in the case where the oxygen anneal was performed, even when the thickness of the aluminum oxide film was not more than the intended value, the threshold voltage was not less than 0.5 V so that the resulting element had a threshold voltage of not less than 0.5 V and was capable of performing a stable normally-off operation, as shown in FIG. 5. Note that "EOT" shown in the drawing stands for the equivalent oxide thickness of the thickness of the aluminum oxide film. To reduce a channel resistance which determines the ON voltage of the element, the thickness intended herein has a limited upper-limit value. Typically, when the EOT is not more than 50 nm, the channel resistance is relatively low so that the element shows excellent properties as a power device. When the EOT is not more than 40 nm, the channel resistance is sufficiently reduced to allow the device to perform a high-speed operation with a lower loss. The lower limit of the EOT may appropriately be determined using a maximum gate voltage applied to the gate insulating film and a surge voltage in a usage environment. Typically, the EOT of not less than 5 nm is required. In FIG. 5, in the case where oxygen anneal was performed on the gate insulating film 4 having the $SiO_2/Al_2O_3$ multi-layer structure in the present embodiment, when the EOT was not less than 23 nm, a threshold voltage of not less than 0.5 V was achieved.

Also, as shown in FIG. 6, the fixed charge density (Q1) in the aluminum oxide film in the vicinity of the interface between the aluminum oxide film and the GaN layer 2 was $-2.16 \times 10^{11}$ $cm^{-2}$ when the nitrogen anneal was performed and $-4.60 \times 10^{11}$ $cm^{-2}$ when the oxygen anneal was performed (in which the negative sign shows negative fixed charges).

When a silicon dioxide film is used as the second insulating film 4b, since aluminum has an oxygen binding force larger than that of silicon, the oxygen contained in the silicon dioxide film is reduced to be more likely to move into the aluminum oxide film. Accordingly, mere use of the silicon dioxide film as the second insulating film 4b provides a structure which supplies oxygen to the aluminum oxide film.

However, when the nitrogen anneal is performed, oxygen is not supplied from an atmosphere during the anneal. Accordingly, oxygen moves from the silicon dioxide film to the aluminum oxide film and thus increases the charge density in the aluminum oxide film, but the resulting effect is not sufficient. Consequently, in the vicinity of the interface with the GaN layer 2, negative fixed charges are provided at a density of about $1.5 \times 10^{11}$ $cm^{-2}$. As a result, the threshold voltage is around the value shown above and a stable normally-off element cannot be provided.

By contrast, when the oxygen anneal is performed, oxygen is supplied during the anneal. Accordingly, even when oxygen moves from the silicon dioxide film to the aluminum oxide film and thus increases the charge density in the aluminum oxide film, the amount of positive charges in the interface between the aluminum oxide film and the silicon dioxide film can be reduced. Consequently, in the vicinity of the interface with the GaN layer 2, negative fixed charges are provided at a density of about $1.5 \times 10^{11}$ $cm^{-2}$. As a result, the threshold voltage has a large value and a stable normally-off element can be provided.

That is, to provide a normally-off element, the total amount of charges in the gate insulating film 4 is important.

When the negative fixed charge density in the vicinity of the interface with the GaN layer 2 becomes not less than $2.5 \times 10^{11}$ cm$^{-2}$, it is possible to provide a normally-off element. When the fixed charge density (Q1) in the aluminum oxide film in the vicinity of the interface between the aluminum oxide film and the GaN layer 2 is about $-4.60 \times 10^{11}$ cm$^{-2}$ (where the negative sign shows negative fixed charges) as in the present embodiment, it is possible to reliably provide a normally-off element.

Thus, when the gate insulating film 4 is provided with the multi-layer structure including the first and second insulating films 4a and 4b and the first insulating film 4a is formed of an insulating film containing an element having an oxygen binding force larger than that of the element contained in the second insulating film 4b, the total charge amount can be increased. That is, by performing the oxygen anneal, it is possible to perform the step of supplying oxygen (O) into the silicon dioxide film and increase the negative fixed charge density in the vicinity of the interface with the GaN layer 2. This allows the negative fixed charge density in the vicinity of the interface with the GaN layer 2 to be set to a value of not less than $2.5 \times 10^{11}$ cm$^{-2}$ and allows a normally-off element to be reliably provided.

Subsequently, a method of manufacturing the horizontal HEMT according to the present embodiment will be described with reference to FIGS. 7A to 7D.

(Step Shown in FIG. 7A)

A compound semiconductor substrate having a structure in which the GaN layer 2 and the AlGaN layer 3 are stacked on the top surface of the substrate 1 made of Si(111), SiC, sapphire, or the like is prepared. For example, on the top surface of the substrate 1, the GaN layer 2 and the AlGaN layer 3 are formed by an MOCVD (Metal Organic Chemical Vapor Deposition) method, or an MBE (Molecular Beam Epitaxy) method controlled to an ultrahigh purity and with high accuracy.

Figure 7B:
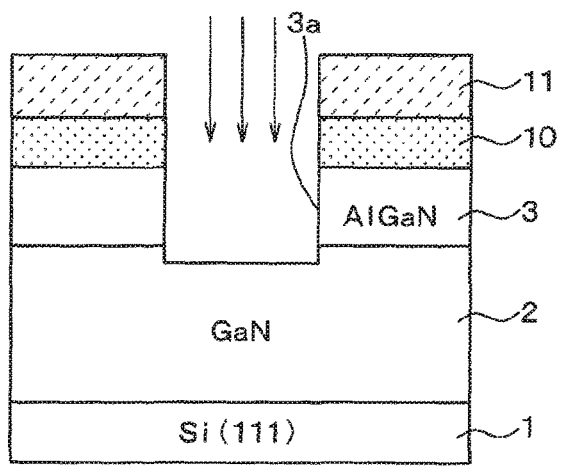
FIG. 7B is a cross-sectional view showing the manufacturing process of the semiconductor device shown in FIG. 1.

(Step Shown in FIG. 7B)

After the oxide film 10 serving as the interlayer film is formed on the top surface of the AlGaN layer 3, a resist 11 serving as a second mask is formed on the top surface of the oxide film 10. Then, after the resist 11 is patterned through a photolithographic step, using the resist film 11 as a mask, the oxide film 10 is patterned. Thus, over the position on the top surface of the AlGaN layer 3 where the gate structure is to be formed, the resist 11 and the oxide film 10 are opened. Then, by performing a dry etching step using the resist film 11 and the oxide film 10 as a mask, the top surface of the AlGaN layer 3 is recessed to be formed with the recess-shaped portion 3a exposing the top surface of the GaN layer 2. After the recess-shaped portion 3 is formed, the resist 11 used as the mask for the dry etching is removed to end the dry etching step.

Figure 7C:
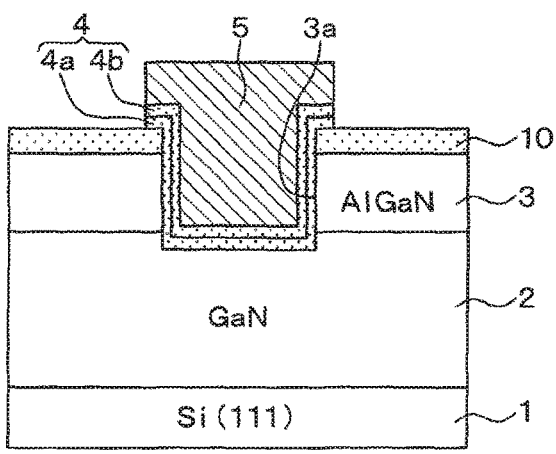
FIG. 7C is a cross-sectional view showing the manufacturing process of the semiconductor device shown in FIG. 1.

(Step Shown in FIG. 7C)

Then, the step of forming the gate insulating film 4 is performed. For example, by an atomic layer deposition (ALD) method or a sputtering method, an aluminum oxide film or the like is formed to form the first insulating film 4a. Subsequently, by a CVD (Chemical vapor deposition) method, a plasma CVD method, an ALD method, or the like, a silicon dioxide film or the like is formed to form the second insulating film 4b over the first insulating film 4a. At this time, depending on a film deposition method, the temperature reached is as high as about 700° C. when the second insulating film 4b is formed by the CVD method or 500° C. or less even when the second insulating film 4b is formed by the plasma CVD method. Consequently, oxygen in the second insulating film 4b is more likely to move therefrom into the first insulating film 4a. In other words, oxygen tends to move into the one of the first and second insulating films 4a and 4b where oxygen is more stable. Therefore, oxygen tends to move toward the element contained in the first insulating film 4a and having an oxygen binding force larger than that of the element contained in the second insulating film 4b.

Accordingly, after the formation of the first insulating film 4a and at least before or after the formation of the second insulating film 4b, an oxygen anneal step is performed as an oxygen supplying step. Thus, the filling of the first insulating film 4a with oxygen or the filling of the first and second insulating films 4a and 4b with oxygen is performed. Consequently, oxygen moves from the second insulating film 4b to the first insulating film 4a to increase the charge density in the first insulating film 4a and increase the negative fixed charge density in the vicinity of the interface with the GaN layer 2. As a result, the negative fixed charge density in the gate insulating film 4 in the vicinity of the interface with the GaN layer 2 becomes about $2.5 \times 10^{11}$ cm$^{-2}$ and the threshold voltage has a large value to allow a stable normally-off element to be provided.

Then, on the top surface of the gate insulating film 4 including the inside of the recess-shaped portion 3a, polysilicon doped with an impurity or a metal material such as Al are sequentially deposited and patterned using a mask not shown. At this time, when the gate electrode 5 is formed of the polysilicon doped with the impurity by CVD, the gate electrode 5 can be formed at a low temperature without being subjected to activation anneal. In this manner, the gate insulating film 4 and the gate electrode 5 are formed.

Figure 7D:
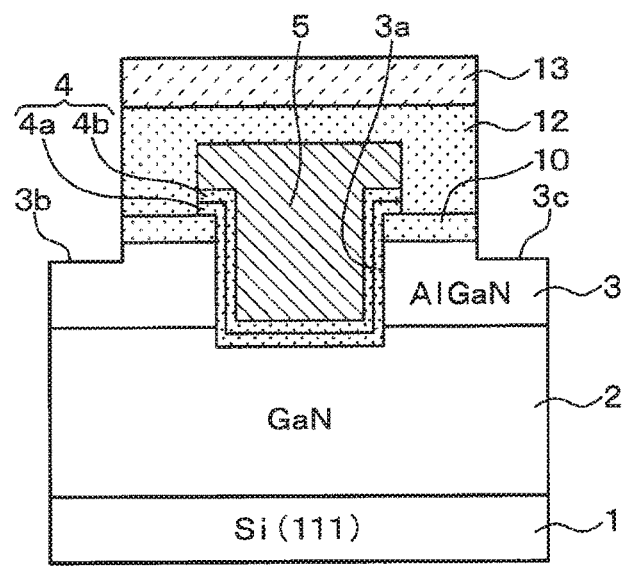
FIG. 7D is a cross-sectional view showing the manufacturing process of the semiconductor device shown in FIG. 1.

(Step Shown in FIG. 7D)

An insulating film and a mask which cover the gate insulating film 4 and the gate electrode 5 and open the regions where the trench portions 3b and 3c are to be formed are formed. For example, the insulating film can be formed by forming an oxide film 12 and then forming a resist 13 serving as a mask on the top surface of the oxide film 12. Then, using the resist 13, a dry etching step is performed on the oxide film 12 and the AlGaN layer 3 to form the trench portions 3b and 3c in the top surface of the AlGaN layer 3. Then, the resist 13 is removed.

The subsequent steps are the same as performed conventionally. Through the step of forming the interlayer insulating film, the step of forming the contact holes, the step of forming the source electrode 6 and the drain electrode 7, the semiconductor device having the horizontal HEMT shown in FIG. 1 is completed.

Second Embodiment

A second embodiment of the present disclosure will be described. The present embodiment is obtained by changing the constituent materials of the gate insulating film 4 in the first embodiment. Since the present embodiment is otherwise the same as the first embodiment, a description will be given only of the portion of the present embodiment which is different from that of the first embodiment.

Figure 8:
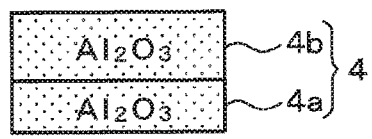
FIG. 8 is a view showing a cross-sectional structure of a gate insulating film included in a horizontal HEMT according to a second embodiment of the present disclosure.

As shown in FIG. 8, in a semiconductor device having a horizontal HEMT according to the present embodiment, each of the first and second insulating films 4a and 4b included in the gate insulating film 4 is formed of a metal oxide film such as aluminum oxide. The main components of the constituent materials of the first and second insulating films 4a and 4b are the same but, in the first insulating film 4a, an oxygen concentration is higher, i.e., the oxygen vacancy concentration is lower than in the second insulating film 4b.

Even when the main components of the respective constituent materials of the first and second insulating films 4a and 4b are the same, by setting the oxygen vacancy concentration lower in the first insulating film 4a than in the second insulating film 4b, it is possible to provide the horizontal HEMT as a normally-off element in the same manner as in the first embodiment.

When the gate insulating film 4 is formed only of a metal oxide such as aluminum oxide, oxygen leak increases to increase the oxygen vacancy concentration. For example, when the gate insulating film 4 is formed of aluminum oxide, the stoichiometric ratio between Al and O is Al:O=2:3 but, due to oxygen leak, the ratio of oxygen is lower than the stoichiometric ratio thereof. By contrast, in the present embodiment, the oxygen ratio is higher in the first insulating film 4a than in the second insulating film 4b and the ratio between Al and O is closer to 2:3 as the stoichiometric ratio therebetween. Consequently, the negative fixed charge density in the gate insulating film 4 in the vicinity of the interface with the GaN layer 2 is not less than $2.5 \times 10^{11}$ cm$^{-2}$. As a result, the threshold voltage has a large value and a stable normally-off element can be provided.

A method of manufacturing a semiconductor device having a horizontal HEMT thus configured is basically the same as in the first embodiment and it is sufficient to modify only the step of forming the gate insulating film 4. Specifically, in the step of forming the gate insulating film 4, the first and second insulating films 4a and 4b are continuously formed by an atomic layer deposition method, a sputtering method, or the like to form the gate insulating film 4 but, after the step of forming the first insulating film 4a, an oxygen anneal step is performed. For example, the first and second insulating films 4a and 4b are formed continuously in the same chamber but, after the formation of the first insulating film 4a, the film deposition step is temporarily halted, the oxygen anneal step is performed, and then the film deposition step is resumed to form the second insulating film 4b. This allows an oxygen supplying step to be performed on the first insulating film 4a and increases the oxygen concentration in the first insulating film 4a. Even when a heat treatment step is performed when or after the second insulating film 4b is formed and oxygen leaks from the first insulating film 4a, the oxygen concentration can be held higher than in the second insulating film 4b.

Third Embodiment

A third embodiment of the present disclosure will be described. The present embodiment is obtained by changing the order in which the components of the gate insulating film 4 are formed inform that in the first embodiment. Since the present embodiment is otherwise the same as the first embodiment, a description will be given only of the portion of the present embodiment which is different from that of the first embodiment.

Figure 9:
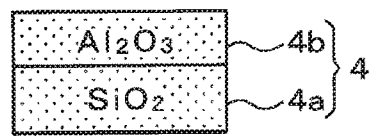
FIG. 9 is a view showing a cross-sectional structure of a gate insulating film included in a horizontal HEMT according to a third embodiment of the present disclosure.

As shown in FIG. 9, in a semiconductor device having a horizontal HEMT according to the present embodiment, the order in which the first and second insulating films 4a and 4b included in the gate insulating film 4 are formed in the first embodiment is reversed. Specifically, the first insulating film 4a is formed of a silicon dioxide film or a silicon oxynitride film and the second insulating film 4b is formed of a metal oxide such as an aluminum oxide film or a metal nitride such as aluminum nitride.

Figure 10:
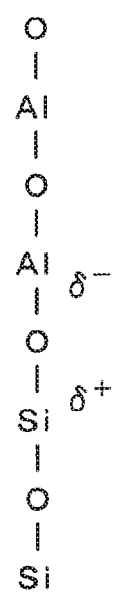
FIG. 10 is a view showing a molecular structure in the gate insulating film shown in FIG. 9.

Thus, it is also possible to interchange the respective materials forming the first and second insulating films 4a and 4b and form the upper-layer second insulating film 4b of a material containing an element having an oxygen binding force larger than that of the element contained the lower-layer first insulating film 4a. In the gate insulating film 4 thus configured, the first and second insulating films 4a and 4b have different atomic bonds at the interface between the first and second insulating films 4a and 4b. Accordingly, at the interface between the first and second insulating films 4a and 4b, oxygen and the respective elements contained in the first and second insulating films 4a and 4b are bonded to each other with different polarities. For example, as shown in FIG. 10, when the first insulating film 4a is formed of a silicon dioxide film or the like and the second insulating film 4b is formed of aluminum oxide, silicon has a positive polarity ($\delta+$) and aluminum has a negative polarity ($\delta-$). Consequently, due to the difference between the polarities $\delta+$ and $\delta-$ at the interface between the first and second insulating films 4a and 4b, the fixed charge density becomes not less than $2.5 \times 10^{11}$ cm$^{-2}$ to allow a threshold voltage to be increased. Accordingly, in the same manner as in the first embodiment, it is possible to provide the horizontal HEMT as a normally-off element.

A method of manufacturing the semiconductor device having the horizontal HEMT thus configured is basically the same as in the first embodiment and it is sufficient to modify only the step of forming the gate insulating film 4. Specifically, in the step of forming the gate insulating film 4, the first insulating film 4a is formed of a silicon dioxide film or the like by a CVD method or the like, and then the second insulating film 4b is formed of a metal oxide or metal nitride by an atomic layer deposition method, a sputtering method, or the like. Then, after the step of forming the first insulating film 4a, an oxygen anneal step is performed as an oxygen supplying step. At this time, since silicon or the like contained in the constituent material of the first insulating film 4a is an element having an oxygen binding force smaller than that of the metal contained in the metal oxide forming the second insulating film 4b, a metastable state where bonds to oxygen are unstable is provided in the first insulating film 4a so that oxygen is likely to leak. Therefore, to allow oxygen leak to be suppressed, after the deposition of the first insulating film 4a, the steps are preferably performed in a temperature process in which oxygen movement from the first insulating film 4a to the second insulating film 4b is unlikely to occur. Specifically, when the step of forming the second insulating film 4b and the process of forming the gate electrode 5, the source electrode 6, and the drain electrode 7 are performed in a temperature process at 700° C. or less, or preferably 300° C. or less, it is possible to suppress oxygen leak from the first insulating film 4b.

Fourth Embodiment

A fourth embodiment of the present disclosure will be described. The present embodiment is obtained by changing the configuration of the gate insulating film 4 in each of the first to third embodiments. Since the present embodiment is otherwise the same as the first to third embodiments, a description will be given only of the portion of the present embodiment which is different from those of the first to third embodiments.

In a semiconductor device having a horizontal HEMT according to the present embodiment, the first insulating film 4a included in the gate insulating film 4 in each of the first to third embodiments is placed in a microcrystal state, while the second insulating film 4b included therein is placed in an amorphous state. The microcrystal state means a state where a crystal is mixed in an amorphous state, not a state where a film is entirely crystallized.

As a result of thus placing the first insulating film 4a in the microcrystal state and placing the second insulating film 4b in the amorphous state, in the first insulating film 4a that is crystallized, oxygen is at a lattice location so that oxygen leak is less likely to occur. This allows the first insulating film 4a to have an oxygen vacancy concentration lower than that of the second insulating film 4b and further allows the effects of the above-described first to third embodiments to be obtained.

OTHER EMBODIMENTS

The present disclosure is not limited to the embodiments described above and can appropriately be modified.

In each of the above-described embodiments, a structure which supplies an element other than oxygen, e.g., nitrogen or silicon to the first and second insulating films 4a and 4b to prevent crystallization and thus more reliably suppress leak may also be used.

In the above-described embodiments, as a channel forming layer formed of a nitride semiconductor, the GaN layer 2 and the AlGaN layer 3 have been described by way of example. However, it may also be possible to form the channel forming layer of a nitride semiconductor containing a nitride of another group III element as a main component.

It is understood that the present disclosure has been described in accordance with the embodiments, but the present disclosure is not limited to the embodiments and the structures thereof. The present disclosure also encompasses variations in the equivalent range as various modifications. In addition, various combinations and embodiments, and further, only one element thereof, less or more, and the form and other combinations including, are intended to fall within the spirit and scope of the present disclosure.

The invention claimed is:

1. A semiconductor device comprising:
    a switching device including:
        a substrate formed of a semi-insulating material or a semiconductor material;
        a channel forming layer having a first nitride semiconductor layer formed of GaN and a second nitride semiconductor layer on the substrate, the channel forming layer forming a heterojunction structure and having a recessed portion at which the second nitride semiconductor layer is partly removed to expose the first nitride semiconductor layer;
        a gate structure including a gate insulating film disposed in the recessed portion and a gate electrode disposed on the gate insulating film; and
        a source electrode and a drain electrode disposed on the channel forming layer on opposite sides of the gate structure, wherein
        the gate insulating film has a multi-layer structure including a first insulating film disposed on a surface of the recessed portion and a second insulating film disposed on the first insulating film,
    the first insulating film contains an element having an oxygen binding force larger than an oxygen binding force of an element contained in the second insulating film, and
    the gate insulating film has a negative fixed charge density of not less than $2.5 \times 10^{11}$ cm$^{-2}$ in the vicinity of an interface with the first nitride semiconductor layer.

2. The semiconductor device according to claim 1, wherein
    the first insulating film is formed of a metal oxide or metal nitride, and
    the second insulating film is formed of a silicon dioxide film or silicon oxynitride film.

3. The semiconductor device according to claim 1, wherein
    the gate electrode is formed of polysilicon doped with boron.

4. The semiconductor device according to claim 1, wherein
    the first insulating film is in a microcrystalline state where a crystal is mixed in an amorphous state, and the second insulating film is in an amorphous state.

5. A semiconductor device comprising:
    a switching device including:
        a substrate formed of a semi-insulating material or a semiconductor material;
        a channel forming layer having a first nitride semiconductor layer and a second nitride semiconductor layer on the substrate, the channel forming layer forming a heterojunction structure and having a recessed portion at which the second nitride semiconductor layer is partly removed to expose the first nitride semiconductor layer;
        a gate structure including a gate insulating film disposed in the recessed portion and a gate electrode disposed on the gate insulating film; and
        a source electrode and a drain electrode disposed on the channel forming layer on opposite sides of the gate structure, wherein
    the gate insulating film has a multi-layer structure including a first insulating film disposed on a surface of the recessed portion and a second insulating film disposed on the first insulating film, and
    the first and second insulating films are formed of a same one of a metal oxide and a metal nitride, the one of the metal oxide and the metal nitride forming the first insulating film has an oxygen vacancy concentration lower than an oxygen vacancy concentration of the one of the metal oxide and the metal nitride forming the second insulating film.

6. A semiconductor device comprising:
    a switching device including:
        a substrate formed of a semi-insulating material or a semiconductor material;
        a channel forming layer having a first nitride semiconductor layer formed of GaN and a second nitride semiconductor layer on the substrate, the channel forming layer forming a heterojunction structure and having a recessed portion at which the second nitride semiconductor layer is partly removed to expose the first nitride semiconductor layer;
        a gate structure including a gate insulating film disposed in the recessed portion and a gate electrode disposed on the gate insulating film; and
        a source electrode and a drain electrode disposed on the channel forming layer on opposite sides of the gate structure, wherein
    the gate insulating film has a multi-layer structure including a first insulating film disposed on a surface of the recessed portion and a second insulating film disposed on the first insulating film, the second insulating film contains an element having an oxygen binding force larger than an oxygen binding force of an element contained in the first insulating film, and the gate insulating film has a negative fixed charge density of not less than $2.5 \times 10^{11}$ cm$^{-2}$ in the vicinity of an interface with the first nitride semiconductor layer.

7. The semiconductor device according to claim 6, wherein the first insulating film is formed of a silicon dioxide film or silicon oxynitride film, and the second insulating film is formed of a metal oxide or metal nitride.

8. A method for manufacturing a semiconductor device, the semiconductor device including a switching device having:

a substrate formed of a semi-insulating material or a semiconductor material;

a channel forming layer having a first nitride semiconductor layer and a second nitride semiconductor layer on the substrate, the channel forming layer forming a heterojunction structure and having a recessed portion at which the second nitride semiconductor layer is partly removed to expose the first nitride semiconductor layer;

a gate structure including a gate insulating film disposed in the recessed portion and a gate electrode disposed on the gate insulating film; and a source electrode and a drain electrode disposed on the channel forming layer on opposite sides of the gate structure, the method comprising:

forming the gate insulating film, wherein the forming of the gate insulating film includes forming a first insulating film on a surface of the recessed portion and forming a second insulating film on the first insulating film, the forming of the first insulating film and the forming of the second insulating film use materials such that a material of the first insulating film contains an element having an oxygen binding force larger than an oxygen binding force of an element contained in a material of the second insulating film, the method further comprising:

performing oxygen anneal to fill the first insulating film with oxygen, after the forming of the first insulating film, and before or after the forming of the second insulating film.

9. The method for manufacturing the semiconductor device according to claim 8, wherein in the forming of the first insulating film, the first insulating film is formed of a metal oxide or metal nitride, and in the forming of the second insulating film, the second insulating film is formed of a silicon dioxide film or silicon oxynitride film.

10. A method for manufacturing a semiconductor device, the semiconductor device including a switching device having:

a substrate formed of a semi-insulating material or a semiconductor material;

a channel forming layer having a first nitride semiconductor layer and a second nitride semiconductor layer on the substrate, the channel forming layer forming a heterojunction structure and having a recessed portion at which the second nitride semiconductor layer is partly removed to expose the first nitride semiconductor layer;

a gate structure including a gate insulating film disposed in the recessed portion and a gate electrode disposed on the gate insulating film; and a source electrode and a drain electrode disposed on the channel forming layer on opposite sides of the gate structure, the method comprising:

forming the gate insulating film, wherein the forming of the gate insulating film includes forming a first insulating film on a surface of the recessed portion and forming a second insulating film on the first insulating film, in the forming of the first insulating film and the forming of the second insulating film, the first insulating film and the second insulating film are formed of a same one of a metal oxide and a metal nitride, the method further comprising:

performing oxygen anneal to fill the first insulating film with oxygen, after the forming of the first insulating film and before the forming of the second insulating film.

11. A method for manufacturing a semiconductor device, the semiconductor device including a switching device having:

a substrate formed of a semi-insulating material or a semiconductor material;

a channel forming layer having a first nitride semiconductor layer and a second nitride semiconductor layer on the substrate, the channel forming layer forming a heterojunction structure and having a recessed portion at which the second nitride semiconductor layer is partly removed to expose the first nitride semiconductor layer;

a gate structure including a gate insulating film disposed in the recessed portion and a gate electrode disposed on the gate insulating film; and a source electrode and a drain electrode disposed on the channel forming layer on opposite sides of the gate structure, the method comprising:

forming the gate insulating film, wherein the forming of the gate insulating film includes forming a first insulating film on a surface of the recessed portion and forming a second insulating film on the first insulating film, the forming of the first insulating film and the forming of the second insulating film use materials such that a material of the second insulating film contains an element having an oxygen binding force larger than an oxygen binding force of an element contained in a material of the first insulating film, the method further comprising:

forming the gate electrode; and forming the source electrode and the drain electrode, wherein the forming of the second insulating film, the forming of the gate electrode, and the forming of the source electrode and the drain electrode are each performed after the forming of the first insulating film, and are each performed in a process at a temperature of 700° C. or less.

12. The method of manufacturing the semiconductor device according to claim 11, wherein in the forming of the first insulating film, the first insulating film is formed of a silicon dioxide film or silicon oxynitride film, and in the forming of the second insulating film, the second insulating film is formed of a metal oxide or metal nitride.

\* \* \* \* \*